(12) United States Patent
Hsu et al.

(10) Patent No.: US 10,186,495 B2
(45) Date of Patent: Jan. 22, 2019

(54) FILM FOR SEMICONDUCTOR DEVICE AND FABRICATION METHOD THEREOF

(71) Applicant: XIAMEN SAN'AN OPTOELECTRONICS CO., LTD., Xiamen (CN)

(72) Inventors: Chen-ke Hsu, Xiamen (CN); Junpeng Shi, Xiamen (CN); Xiaojuan Shao, Xiamen (CN); Kechuang Lin, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 15/871,224

(22) Filed: Jan. 15, 2018

(65) Prior Publication Data

US 2018/0138142 A1 May 17, 2018

Related U.S. Application Data

(63) Continuation of application No. PCT/CN2017/087716, filed on Jun. 9, 2017.

(30) Foreign Application Priority Data

Aug. 5, 2016 (CN) .......................... 2016 1 0636215

(51) Int. Cl.
*H01L 23/00* (2006.01)
*H01L 21/683* (2006.01)
*H01L 21/64* (2006.01)

(52) U.S. Cl.
CPC .............. *H01L 24/32* (2013.01); *H01L 21/64* (2013.01); *H01L 21/683* (2013.01); *H01L 21/6836* (2013.01); *H01L 24/27* (2013.01); *H01L 2221/68336* (2013.01)

(58) Field of Classification Search
CPC ....................................... H01L 24/32
See application file for complete search history.

(56) References Cited

U.S. PATENT DOCUMENTS

| | | | | |
|---|---|---|---|---|
| 2010/0099240 A1* | 4/2010 | Watanabe | ................ | C09J 7/385 438/464 |
| 2010/0233409 A1* | 9/2010 | Kamiya | ............. | C08G 18/6229 428/41.5 |
| 2010/0291739 A1* | 11/2010 | Hong | ..................... | C09J 163/00 438/124 |
| 2014/0205816 A1* | 7/2014 | Maejima | ............. | H01L 21/6836 428/200 |

(Continued)

FOREIGN PATENT DOCUMENTS

JP H05206267 A 8/1993
JP 2009130332 A 6/2009

*Primary Examiner* — Walter H Swanson
(74) *Attorney, Agent, or Firm* — Syncoda LLC; Feng Ma; Junjie Feng

(57) ABSTRACT

A film for semiconductor device includes a base material and an adhesive layer formed over the base material. The film is divided into an adhesive area and an expansion area. The elasticity modulus of the expansion area is less than that of the adhesive area. When tensile strength is applied on the film, the expansion area is more prone to tensile deformation than the adhesive area. When this film is used for film expansion of semiconductor devices, the devices can be evenly and orderly arranged on the film.

19 Claims, 9 Drawing Sheets

(56) References Cited

U.S. PATENT DOCUMENTS

2016/0181140 A1* 6/2016 Moriyama .............. B32B 27/00
    257/737
2016/0368103 A1* 12/2016 Shearer .................. B23K 35/26

* cited by examiner

FILM FOR SEMICONDUCTOR DEVICE AND FABRICATION METHOD THEREOF

CROSS-REFERENCE TO RELATED APPLICATIONS

The present application is a continuation of, and claims priority to, PCT/CN2017/087716 filed on Jun. 9, 2017, which claims priority to Chinese Patent Application No. 201610636215.1 filed on Aug. 5, 2016. The disclosures of these applications are hereby incorporated by reference in their entirety.

BACKGROUND

During fabrication process of semiconductor devices, when the wafer is cut into chip cores or after cutting, it is common to use an adhesive film (such as commonly used blue film tape or white film tape in LED chips) for connection and film expansion.

SUMMARY

The inventors of the present disclosure have recognized through research that, after expansion, semiconductor devices are not always distributed over the film evenly. Such uneven arrangement is mainly caused by factors below: I. Adhesive strength between the device and the film. As adhesive strength between the semiconductor device and the film is hardly controllable, it is prone to displacement during film expansion if such adhesive strength is too small or is unevenly distributed under tensile strength. This is especially the case in small-size devices because the contact surface between each device and the film is small, and thereby causes deviation; II. During extrusion, molding, stretch and other fabrication processes, film materials are subject to anisotropy. When the film is applied in film expansion process, entire periphery of the film is stretched in the radius direction and loaded with tensile stress. With such anisotropy, tensile properties of the film within the surface become uneven.

FIG. 1. Illustrates that, after expansion, semiconductor devices are not always distributed over the film evenly. To solve the aforementioned problems, the present disclosure provides a film for semiconductor device and a fabrication method for semiconductor device. This film has small elasticity modulus in specific area. Therefore, when tensile strength is applied back on the film, it is more likely to produce tensile deformation. When it is applied in film expansion process of the semiconductor device fabrication, it can reduce displacement during stretch of the device and obtain more uniform and orderly-distributed semiconductor device arrangements.

According to a first aspect of the present disclosure, a film for semiconductor device includes a base material and an adhesive layer formed over the base material, wherein, the film is divided into an adhesive area and an expansion area; elasticity modulus of the expansion area is less than that of the adhesive area; when tensile strength is applied on the film, the expansion area is more prone to tensile deformation than the adhesive area.

In some embodiments, connection strength between the expansion area and the adhesive area is not less than connection strength of the film in the expansion area so that the expansion area of the film can be elongated but not broken when tensile strength is applied on the film.

In some embodiments, ratio of elasticity modulus E1 of the adhesive area and elasticity modulus E2 of the expansion area is greater than 1, and more preferably greater than 2.

In some embodiments, elasticity modulus of the expansion area of the film is below 200 MPa under 23° C., and more preferably 2-150 MPa; elasticity modulus of the adhesive area of the film is above 100 MPa, and more preferably above 150 MPa.

In some embodiments, when tensile strength is applied on the film, ratio of deformation quantity dV1 of the expansion area and deformation quantity dV2 of the adhesive area is greater than 1.

In some embodiments, patterns for the distribution of the adhesive area and the expansion area of the film are designed based on the cutting pattern of the semiconductor device, wherein, the expansion area corresponds to the cut of the cutting pattern of the semiconductor device.

In some embodiments, size of the adhesive area is designed based on the semiconductor device size, which is smaller than or equals to the semiconductor device size.

In some embodiments, the film surface is in grid distribution, wherein, the grid unit is the adhesive area, and the grid line is the expansion area. Preferably, the expansion area is 5-1,000 μm wide.

In the various embodiments of the present disclosure, by controlling the film thickness, elasticity modulus distribution of the film can be controlled so that elasticity modulus of the adhesive area is greater than that of the expansion area. For example, the adhesive area thickness is greater than the expansion area thickness. Or, elasticity modulus of the film can be locally changed through lighting, heating and doping to achieve 2D patterning elasticity modulus distribution while the film thickness is consistent.

In some embodiments, elasticity modulus of the expansion area can be reduced by reducing thickness of the film expansion area. For instance, a groove structure is set in the expansion area of the film, which can be at the front or back of the film, and preferably, at the back of the film. For another instance, extrusion is used to make thickness of the expansion area of the film less than thickness of the adhesive area.

In some embodiments, a strengthened layer with larger elasticity modulus is added in the adhesive area of the film base material, wherein, elasticity modulus of the strengthened layer is greater than that of the base material; and adhesive strength between the fixed layer and the base material is big enough to strengthen elasticity modulus of the adhesive area of the base material. Thus, when tensile strength is applied back on the film base material, elongation deformation of the adhesive area of the base material is greatly decreased affected by the strengthened layer. In some embodiments, elasticity modulus of the base material is 1-200 MPa, and elasticity modulus of the strengthened layer is above 500 MPa; the adhesive layer is formed over the strengthened layer, and adhesive strength between the base material and the strengthened layer is greater than that between the fixed layer and the adhesive layer.

In some embodiments, the base material contains light sensing material; elasticity modulus of the lighted area can be locally changed by lighting the adhesive area or the expansion area of the film so that elasticity modulus of the adhesive area of the film is greater than that of the expansion area.

In some embodiments, the base material contains thermal curing material; elasticity modulus of the heated area can be changed by heating the adhesive area or the expansion area of the film so that elasticity modulus of the adhesive area of the film is greater than that of the expansion area.

In some embodiments, the base material contains activated thinner, wherein, the activated thinner content in the adhesive area is higher than that in the expansion area; activated thinner content in the adhesive area and the expansion area can be controlled so that elasticity modulus of the adhesive area is greater than that of the expansion area.

In some embodiments, the adhesive area of the film is in glassy state, and the expansion area is an elastomer.

According to a second aspect of the present disclosure, a fabrication method for semiconductor device includes: providing a semiconductor wafer, and defining a chip area and a cut area, and forming a cut in the cut area; providing any of the film, and bonding the semiconductor wafer to the film, wherein, the chip area of the wafer corresponds to the adhesive area of the film, and the wafer cut corresponds to the expansion area of the film; dividing the semiconductor wafer into a series of chips along the cut; and applying tensile strength on the film to elongate the expansion area of the film to separate the chips.

The other features and advantages of this present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

Figure 1:
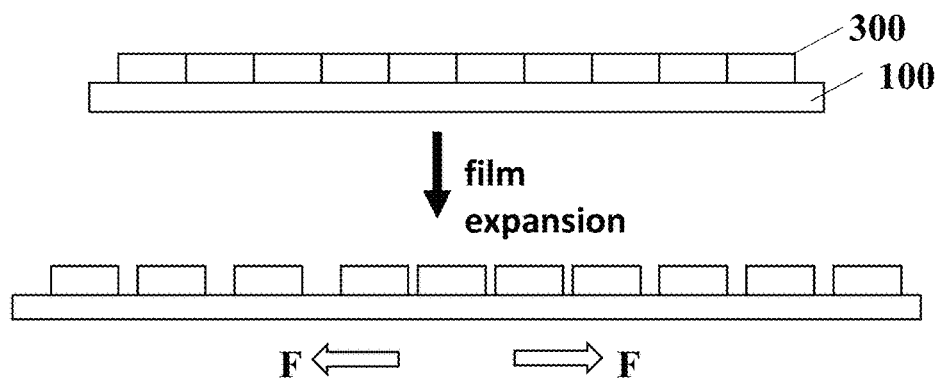
FIG. 1 shows a schematic diagram of film expansion for the existing adhesive film.

In the drawings: 100, existing adhesive film; 200, film of the present disclosure; 200A, adhesive area of the film; 200B, expansion area of the film; 210, base material; 220, adhesive layer; 230, groove; 240, first adhesive layer; 250, elasticity modulus strengthened layer; 300, semiconductor wafer; 310, chip area of the semiconductor wafer/chip; 320, cut; 400, tension device.

DETAILED DESCRIPTION

The embodiments below provide a film for semiconductor device, which is divided into an adhesive area and an expansion area, wherein, elasticity modulus of the expansion area is less than that of adhesive area; and patterns for elasticity modulus distribution can be consistent with the cutting pattern of the semiconductor device.

Figure 2:
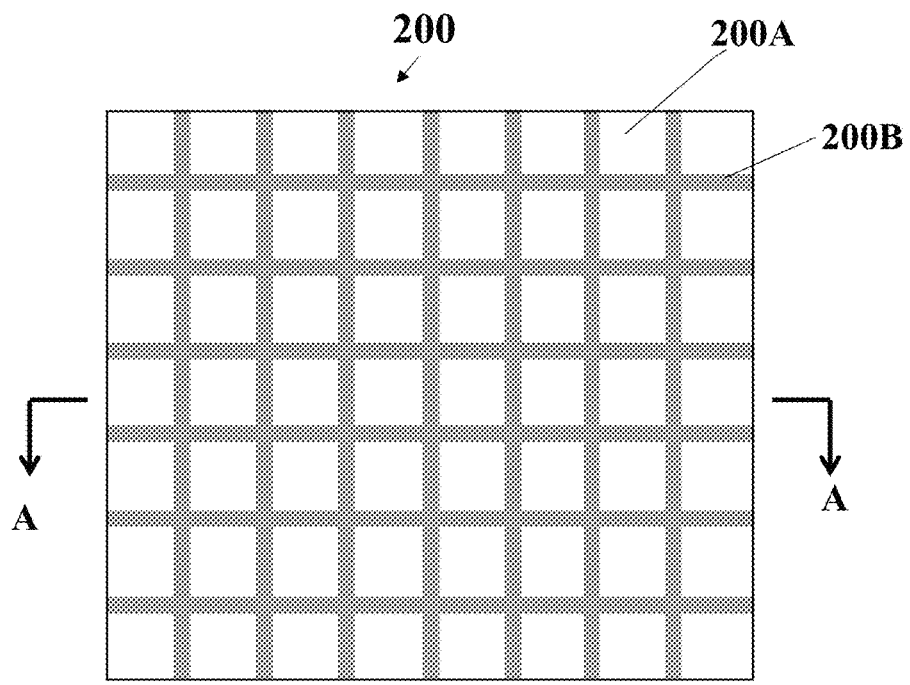
FIG. 2 illustrates a top view of a film according to some embodiments of the present disclosure.
Figure 3:
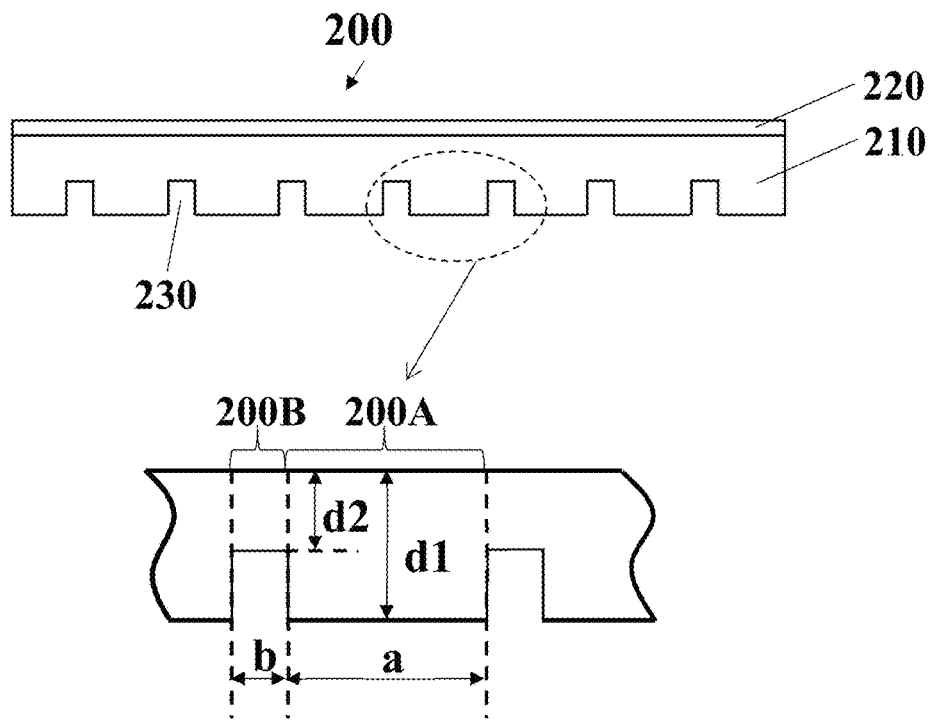
FIG. 3 illustrates a sectional view of a film according to some embodiments of the present disclosure, which is cut along A-A line of FIG. 2.

FIGS. 2 and 3 provide a first preferred embodiment of the present disclosure. An adhesive film 200, includes a base material 210 and an adhesive layer 220 thereon, which is divided into an adhesive area 200A and an expansion area 200B, in which, the adhesive area 200A is used for adhering the semiconductor device with elasticity modulus greater than that of the expansion area 200B. Preferably, elasticity modulus of the film 200 under room temperature (in general, 23° C.) is 1-200 MPa, and ratio of elasticity modulus E1 of the adhesive area and elasticity modulus E2 of the expansion area is greater than 1, and preferably 2-200. Specifically, elasticity modulus of the adhesive area E1 prefers to be 100-200 MPa. Elasticity modulus of the expansion area E2 prefers to be 1-100 MPa. In this way, during film extension, the expansion area has far greater tensile deformation quantity than that of the adhesive area, and is not broken. That means, during film stretch, it is mainly elongated by the expansion area, and elongation in the adhesive area can be ignored.

Elasticity modulus of the film 200 is mainly dependent on material of the base material 210, which is resin film with good stretchability. In this embodiment, the base material 210 can be polyethylene, propylene random copolymer, propylene block copolymer, noblen, polybutylene, polymethylpentene and other polyolefins, ethylene-vinyl acetate copolymer, ionomer resin, ethylene-(methyl) acrylic acid copolymer, ethylene-(methyl) acrylate copolymer, ethylene-butylene copolymer, ethylene-hexene copolymer, polyurethane, polyethylene glycol terephthalate, polyethylene glycol naphthalate and other polyesters, polycarbonate, polyimide, polyetheretherketone, polyetherimide, polyamide, aromatic polyamide, polyphenylene sulfide, aromatic poly amide, fluorine element, polyvinyl chloride, polyvinylidene chloride, cellulose resin, organopolysiloxane resin, etc. The adhesive layer 220 is used for adhering the semiconductor device, which can be UV curing adhesive.

In this embodiment, the adhesive area 200A of the film 200 and the expansion area 200B have same base materials so that connection strength between the adhesive area 200A and the expansion area 200B is big enough. When tensile strength is applied, it is not likely to break at a position between the adhesive area 200A and the expansion area 200B. To make elasticity modulus between the adhesive area 200A of the film and the expansion area 200B different, set the base material thicknesses of the film 200 inconsistent, i.e., the adhesive area 200A is thicker, while the expansion area 200B is thinner so that different areas of a same film have different elasticity modulus. In general, thickness d1 of the base material of the adhesive area 200A can be 5-200 μm, and thickness d2 of the base material of the expansion area 200B is 1/5-4/5 of d1. Preferably, d2 is 1/3-2/3 of d1. During such range, on the one hand, the film 200 has strong adhesive strength and is not easy for break; on the other hand, elasticity modulus of the adhesive area of the film is far larger than that of the expansion area; therefore, during tension process of the film 200, the expansion area 200B is more prone to tensile deformation and provides main elongation deformation quantity. Yet, the adhesive area 200A can hardly produce tensile formation and the elongation deformation quantity is small. This reduces uneven film expansion caused by uneven adhesive layer and also reduces interaction force of the film on the semiconductor device during film stretch. This also decreases the displacement possibility of the device on the film, especially for small-sized devices.

The film 200 is mainly used for semiconductor devices, wherein, the pattern for elasticity modulus distribution is mainly designed based on the cutting pattern of the semiconductor device. The expansion area 200B of the film 200 corresponds to the cut of the cutting pattern, whose size is equal to or larger than the cut size; and size a of the adhesive area 200A is mainly set based on the semiconductor device size, which is less than or equal to the semiconductor device size. Preferably, size a of the adhesive area 200A of the film is equal to or is slightly less than the semiconductor device size. In this embodiment, a series of groove structures 230 are formed over the lower surface of the film 200 in grid distribution, wherein, the gird area 200A is the adhesive area, and the grid line area 200B is the expansion area. The expansion area 200B corresponds to the cut of the semiconductor wafer during singularization. The size b can be 5-1,000 μm, and preferably 10-200 μm, which is determined based on specific applications. Set a groove structure 230 in the corresponding base material 210 of the expansion area 200B to reduce elasticity modulus of the expansion area 200B of the film 200 so that elongation deformation mainly occurs in the expansion area 200B when tensile strength is applied on the film.

In the aforesaid film formation, form the base material 210 through methods well known in the art such as rolling, tape casting in organic solvent, trapped-air process in an enclosed system, T-shape die extrusion, co-extrusion and dry lamination; next, press the front or back side of the base material by a screen printing plate to form a groove structure so that the expansion area is thinner than the adhesive area; next, coat adhesive composition solution over the base material 210 and dry it to form an adhesive layer 220. The coating method is not particularly restricted and examples thereof include: roller coating, silk screen coating, intaglio coating, etc.

Figure 4:
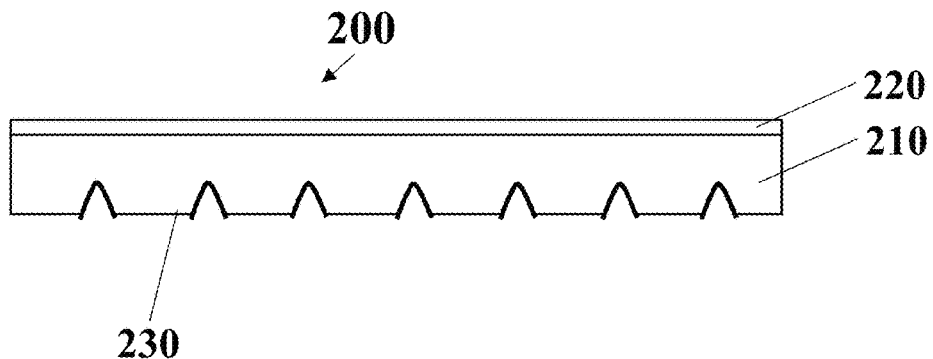
FIG. 4 shows a variant of the film as shown in FIG. 3.

FIG. 4 shows another film structure of the present disclosure. Difference between this film and the film as shown in FIG. 3 is that: the groove structure 230 is different. In this structure, the cross section of the groove structure 230 is arc, and connection strength between the adhesive area and the expansion area of the film is strong to decrease break possibility during film stretch.

Figure 5:
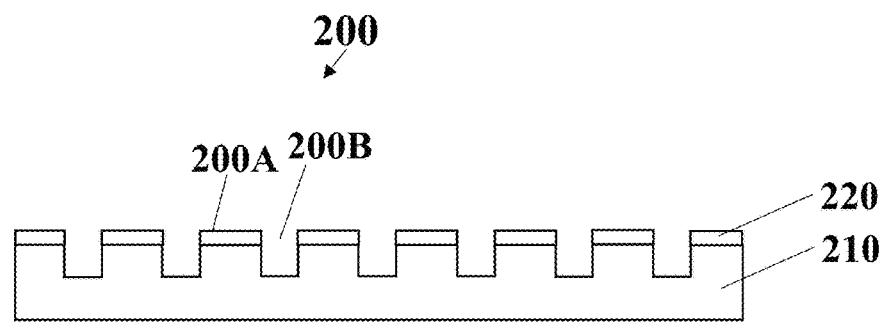
FIG. 5 shows another variant of the film as shown in FIG. 3.

FIG. 5 shows another film structure of the present disclosure. Difference between this film and the film as shown in FIG. 3 is that: the groove structure 230 is formed on the front surface of the film. During film stretch, as the back surface of the film is flat and has strong connection strength. This further reduces displacement during device stretch.

Figure 6:
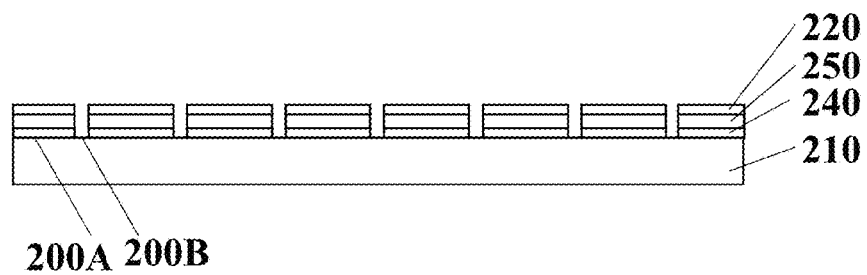
FIG. 6 illustrates a side sectional view of another film according to some embodiments of the present disclosure.

FIG. 6 shows another film structure of the present disclosure. The film 200 includes a base material 210 for connecting the body, a first adhesive layer 240, a strengthened layer 250 and a second adhesive layer 220 thereon. Specifically, the base material 210 is of same material and uniform thickness. Materials can be referred to the aforesaid embodiments. The surface of the base material 210 is divided into an adhesive area 200A and an expansion area 200B, wherein, elasticity modulus E1 of the expansion area is dependent on material of the base material 210, which is 1-200 MPa, and preferably 2-150 MPa; the first adhesive layer 240, the strengthened layer 250 and the second adhesive layer 220 are only formed in the adhesive area 200A of the base material 210, wherein, elasticity modulus 2 of the strengthened layer 250 is far greater than elasticity modulus E1 of the base material 210, preferably above 500 MPa, and more preferably above 1,000 MPa; the material can be glass sheet or metal sheet; adhesive strength between the first adhesive layer 240 and the base material 210 is strong so that the adhesive area 200A of the base material is affected by the strengthened layer 250 during stretch and the elasticity modulus of the adhesive area is close to that of the strengthened layer, and produced tensile deformation quantity is far less than that of the expansion area of the base material; adhesive strength between the second adhesive layer 220 and the curing layer 250 is not necessary strong, which is smaller than required adhesive strength between the first adhesive layer 240 and the base material; therefore, the semiconductor device is easily separated from the film after it is adhered to the film. Material of the second adhesive layer 220 can be referred to the aforesaid embodiments.

Figure 7:
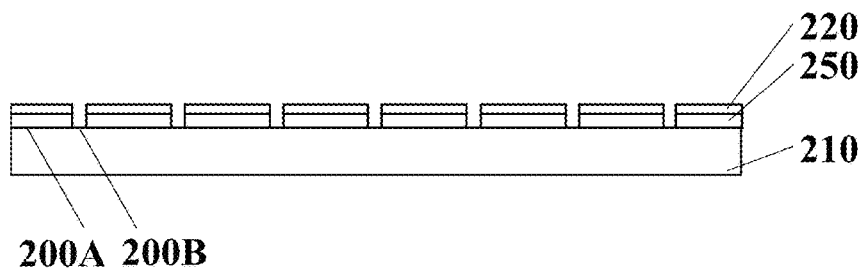
FIG. 7 illustrates a side sectional view of another film according to some embodiments of the present disclosure.

FIG. 7 shows another film structure of the present disclosure. Difference between this film and the film as shown in FIG. 6 is that: The strengthened layer 250, made of high-strength film-forming material, is directly formed over the base material 210 with photosensitive resin. After curing, it has good adhesive strength on the base material. The material can be polyurethane. Specific fabrication method includes: form a base material 210 through any of film fabrication methods well known in the art; next, coat a layer of UV curing resin in the adhesive area over the surface of the base material 210, and cure it with UV light to form a strengthened layer 250 with high elasticity modulus; next, coat adhesive composition solution over the strengthened layer 250 to form a film, dry it to form an adhesive layer 220. As adhesive strength between the strengthened layer 250 and the base material 210 is strong and elasticity modulus of the strengthened layer 250 is far greater than that of the base material 210, elasticity modulus of the adhesive area 200A over the base material 210 can be strengthened; when periphery tensile strength is applied on the base material 210, elongation deformation is mainly in the expansion area 200B. While the adhesive area 200A is not easily to produce elongation deformation under the action of the strengthened layer 250, and it is not prone to displacement as adhesive strength between the strengthened layer and the base material is strong.

Figure 8:
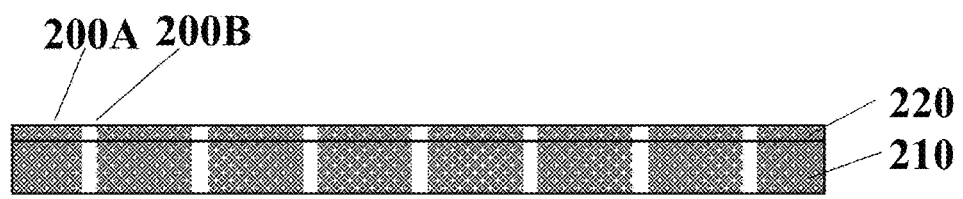
FIG. 8 illustrates a side sectional view of another film according to some embodiments of the present disclosure.

FIG. 8 shows another film structure of the present disclosure. In this embodiment, the base material 210 of the film 200 contains light-sensitive material. Elasticity modulus of the film can be locally changed by lighting to achieve 2D patterning elasticity modulus distribution. Specifically, the light-sensitive material can be aliphatic compound with soft segment, which can be PUA (polyurethane acrylate), polyester acrylate, polyether acrylate and polysiloxane acrylic acid, EP (ethoxyline resin), vinyl ether compounds, etc. According to one embodiment, the base material 210 is mainly photo curing material. Control different lighting intensity and time of the adhesive area and the expansion area so that elasticity modulus of the adhesive area is greater than that of the expansion area. In another embodiment, the base material 210 is mainly common resin doped with photosensitive solvent. After curing, locally light the base material to change elasticity modulus of the film locally. Specific lighting area is based on type of the photosensitive solvent. If the photosensitive solvent is high-elongation material whose material elasticity modulus is reduced after lighting, the expansion area is selected for lighting; if the photosensitive solvent is high-strength material whose elasticity modulus is improved after lighting, the adhesive area is selected for lighting.

As a variant of the aforesaid embodiment, the base material 210 of the film 200 contains photosensitive resin. Activated thinner is added in the photosensitive resin, wherein, activated thinner content in the adhesive area is higher than that in the expansion area. Therefore, during lighting, curing rate of the adhesive area of the base material is quicker and elasticity modulus after curing is higher. Further, control content of activated thinner of the adhesive area and the expansion area so that the adhesive area of the base material after lighting is in a glassy state and the expansion area is an elastomer with low elasticity modulus.

Figure 9:
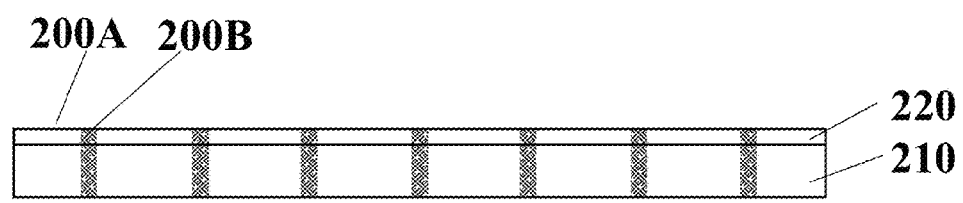
FIG. 9 illustrates a side sectional view of another film according to some embodiments of the present disclosure.

FIG. 9 shows another film structure of the present disclosure. In this embodiment, the base material 210 of the film 200 contains thermosetting resin or thermoplastic resin. Elasticity modulus of the film can be locally changed through heating to achieve 2D patterning elasticity modulus distribution. In another embodiment, the base material 210 is mainly thermocuring material or thermoplastic material. Control different heating intensity and time of the adhesive area and the expansion area so that elasticity modulus of the adhesive area is greater than that of the expansion area. In another embodiment, at first, take initial curing for the base material 210, and partially heat the base material to locally change elasticity modulus of the film. Specific lighting area is determined based on the base material. If elasticity modulus of the material is reduced after heating, select the expansion area for lighting; if elasticity modulus of the material is improved after heating, select the adhesive area for lighting.

Details are described for the application of the film 200 in combination with the fabrication method of the semiconductor device.

Figure 10:
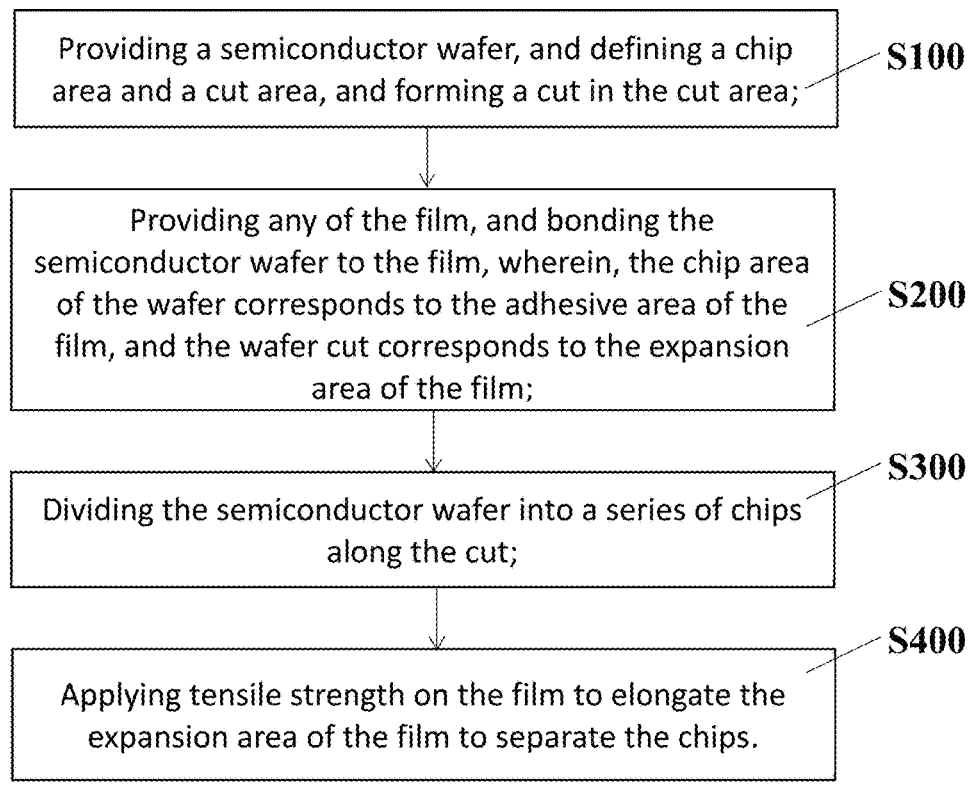
FIG. 10 shows a flow diagram of the fabrication method of a semiconductor device according to some embodiments of the present disclosure.

FIG. 10 shows a flow chart of the fabrication method of a semiconductor device, mainly including steps S100-400. Details are given below in combination with FIGS. 11-15.

Figure 11:
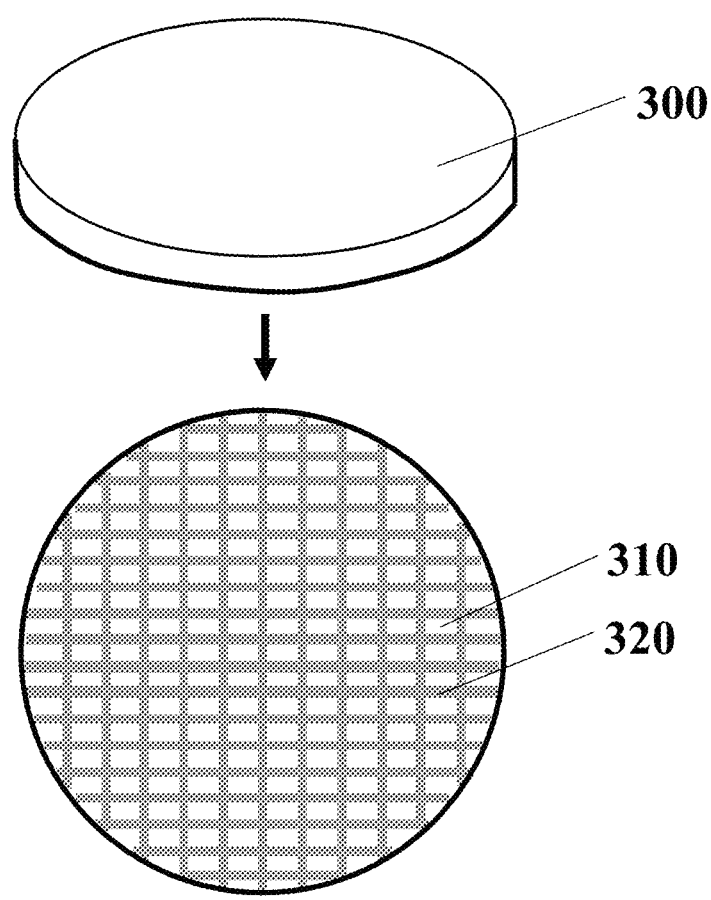
FIG. 11 shows a step in the procedure of the fabrication method of a semiconductor device according to some embodiments of the present disclosure: providing a semiconductor wafer, and defining a chip area and a cutting area on the wafer.

As shown in FIG. 11, provide a semiconductor wafer 300, and define a chip area 310 and a cutting area 320 on the wafer 300, and form a cut 320 in the cut area.

Figure 12:
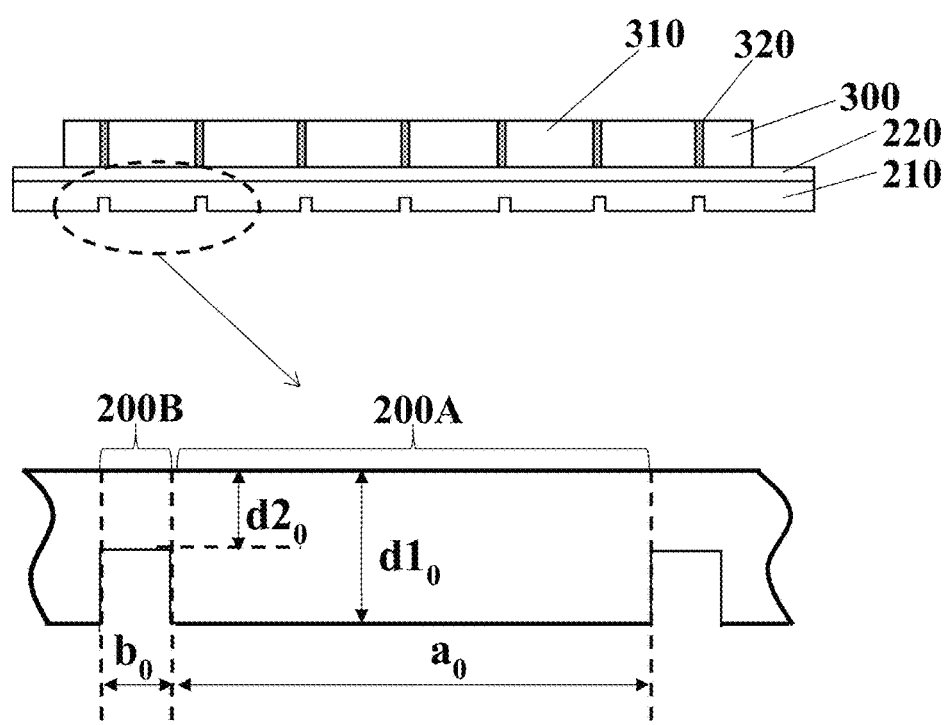
FIG. 12 shows a step in the procedure of the fabrication method of a semiconductor device according to some embodiments of the present disclosure: bonding the semiconductor wafer on any of the film as shown in FIG. 3-9.

As shown in FIG. 12, bond the aforesaid semiconductor wafer 300 on any of the film 200 as shown in FIGS. 3-9. In this embodiment, take the film 200 as shown in FIG. 3 as an example for illustration, wherein, the cut corresponds to the expansion area of the film. Certain deviation is allowed as long as a majority of the adhesive area 200A of the film is in the chip area, preferably within 20%.

Figure 13:
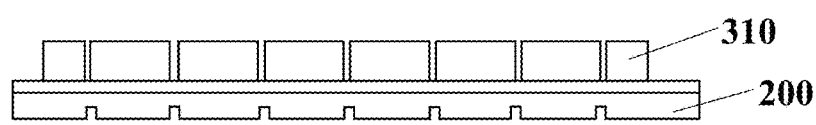
FIG. 13 shows a step in the procedure of the fabrication method of a semiconductor device according to some embodiments of the present disclosure: cutting the wafer into a series of chips.

As shown in FIG. 13, cut the aforesaid wafer 300 into a series of chips 310 along the cut.

Figure 14:
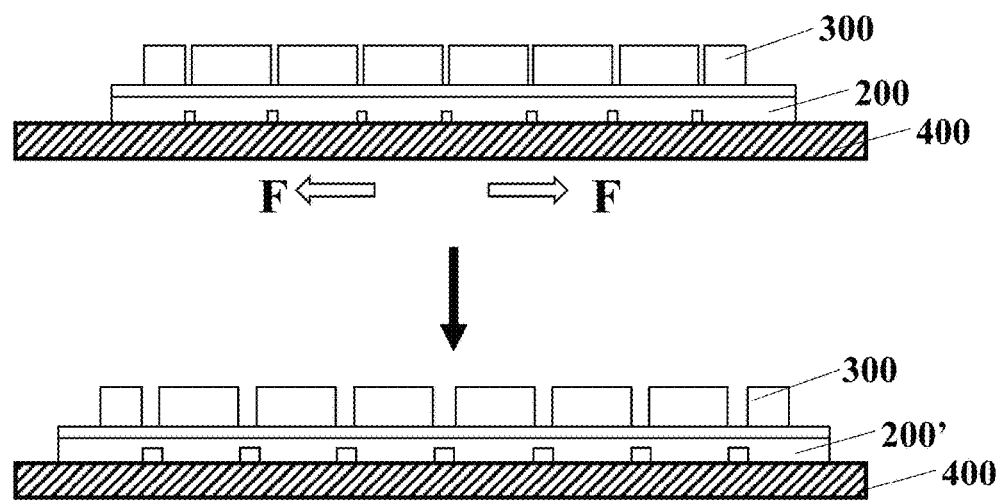
FIG. 14 shows a step in the procedure of the fabrication method of a semiconductor device according to some embodiments of the present disclosure: placing the film together with the chip thereon on a film expansion device, and applying tensile strength on the film for film expansion.

As shown in FIG. 14, place the film 200 together with the chip 310 thereon on a film expansion device 400, and apply tensile strength on the film 200 for film expansion.

Figure 15:
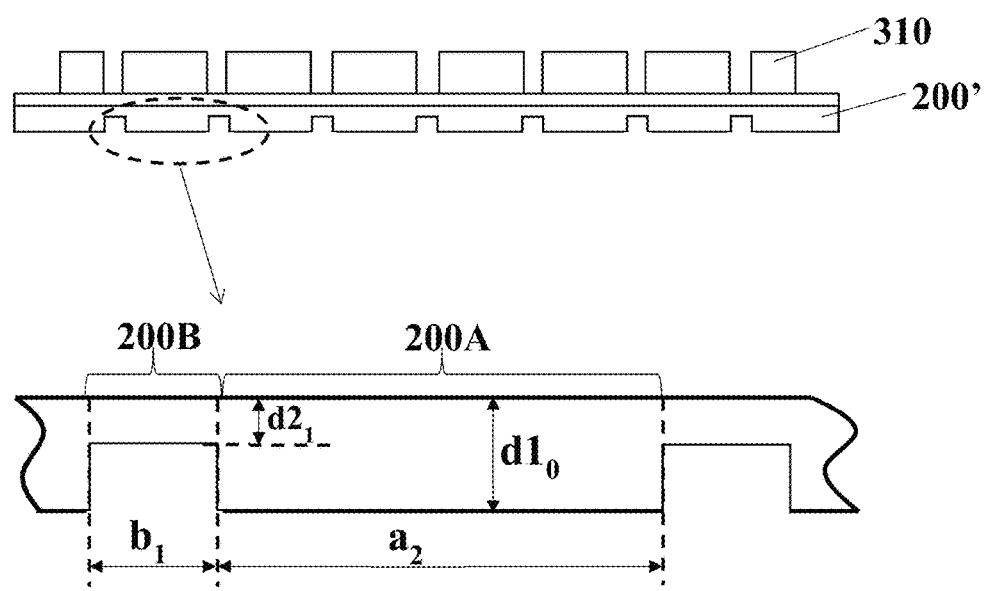
FIG. 15 shows a step in the procedure of the fabrication method of a semiconductor device according to some embodiments of the present disclosure.

Referring to FIGS. 12 and 15, size $a_0$ and size $a_1$ of the adhesive area of the film 200 before and after film expansion have little change, yet size $b_0$ and size $b_1$ of the expansion area before and after film expansion differ a lot. This is because that the expansion area 200B of the film 200 is of small thickness (in this embodiment, $d1_0=2\ d2_0$), and therefore has small elasticity modulus. During film expansion, elongation deformation of the expansion area 200B is large, and elongation deformation of the adhesive area 200B is small. This reduces displacement of device during film expansion, and thereby guarantees that the device after film expansion can be evenly and orderly arranged on the film.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A film for semiconductor device, comprising:
   a base material; and
   an adhesive layer formed over the base material;
   wherein, the film is divided into an adhesive area and an expansion area;
   an elasticity modulus of the expansion area is less than that of the adhesive area;
   when a tensile strength is applied on the film, the expansion area of the film is more prone to tensile deformation than the adhesive area.

2. The film for semiconductor device of claim 1, wherein, a connection strength between the expansion area and the adhesive area of the film is not less than a connection strength of the film in the expansion area so that the expansion area of the film can be elongated and not broken when the tensile strength is applied on the film.

3. The film for semiconductor device of claim 1, wherein, a ratio of an elasticity modulus E1 of the adhesive area and an elasticity modulus E2 of the expansion area is greater than 1, and more preferably greater than 2.

4. The film for semiconductor device of claim 3, wherein, the elasticity modulus E1 of the adhesive area of the film is above 100 MPa under 23° C.

5. The film for semiconductor device of claim 1, wherein, the elasticity modulus of the expansion area of the film is below 200 MPa under 23° C., and more preferably 2-150 MPa.

6. The film for semiconductor device of claim 3, wherein, elasticity modulus E2 of the expansion area of the film is below 200 MPa under 23° C.

7. The film for semiconductor device of claim 1, wherein, when the tensile strength is applied on the film, a ratio of deformation quantity dV1 of the expansion area and deformation quantity dV2 of the adhesive area is greater than 1.

8. The film for semiconductor device of claim 1, wherein, patterns for a distribution of the adhesive area and the expansion area of the film are designed based on a cutting pattern of the semiconductor device, wherein, the expansion area corresponds to a cut of the cutting pattern of the semiconductor device.

9. The film for semiconductor device of claim 1, wherein, a size of the adhesive area is designed based on a semiconductor device size, which is smaller than or equals to the semiconductor device size.

10. The film for semiconductor device of claim 1, wherein, a surface of the film is in grid distribution, wherein, a grid unit is the adhesive area, and a grid line is the expansion area.

11. The film for semiconductor device of claim 8, wherein, a width of the expansion area is 5-1,000 µm wide.

12. The film for semiconductor device of claim 1, wherein, an adhesive area thickness is greater than an expansion area thickness.

13. The film for semiconductor device of claim 1, wherein, the base material contains a light sensing material; an elasticity modulus of a lighted area can be locally changed by lighting the adhesive area or the expansion area of the film so that the elasticity modulus of the adhesive area of the film is greater than that of the expansion area.

14. The film for semiconductor device of claim 1, wherein, the base material contains a thermal curing material; an elasticity modulus of a heated area can be changed by heating the adhesive area or the expansion area of the film so that the elasticity modulus of the adhesive area of the film is greater than that of the expansion area.

15. The film for semiconductor device of claim 1, wherein, the base material contains an activated thinner; an activated thinner content in the adhesive area is higher than that in the expansion area; the activated thinner content in the adhesive area and the expansion area can be controlled so that the elasticity modulus of the adhesive area is greater than that of the expansion area.

16. The film for semiconductor device of claim 1, wherein, the adhesive area of the film is in glassy state, and the expansion area is an elastomer.

17. The film for semiconductor device of claim 1, further comprises:
   a strengthened layer only formed over the base material surface in the adhesive area;
   wherein, an elasticity modulus of the strengthened layer is greater than that of the base material; and
   an adhesive strength between the strengthened layer and the base material is big enough to strengthen the elasticity modulus of the adhesive area of the base material.

18. The film for semiconductor device of claim 17, wherein, the adhesive layer is formed over the strengthened layer, and the adhesive strength between the base material and the strengthened layer is greater than that between a fixed layer and the adhesive layer.

19. The film for semiconductor device of claim 17, wherein, elasticity modulus of the base material is 1-200 MPa, and elasticity modulus of the strengthened layer is above 500 MPa.

\* \* \* \* \*